(12) United States Patent
Yang et al.

(10) Patent No.: US 9,490,349 B1
(45) Date of Patent: Nov. 8, 2016

(54) METHOD OF MANUFACTURING A SEMICONDUCTOR DEVICE

(71) Applicant: Powerchip Technology Corporation, Hsinchu (TW)

(72) Inventors: Wen-Chung Yang, Miaoli County (TW); Te-Yuan Yin, Hsinchu (TW); Ssu-Ting Wang, Taichung (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 14/811,823

(22) Filed: Jul. 28, 2015

(30) Foreign Application Priority Data

May 14, 2015 (TW) .............................. 104115365 A

(51) Int. Cl.
*H01L 29/66* (2006.01)
*H01L 21/02* (2006.01)
*H01L 21/033* (2006.01)
*H01L 21/311* (2006.01)
*H01L 21/28* (2006.01)

(52) U.S. Cl.
CPC ..... *H01L 29/66825* (2013.01); *H01L 21/0223* (2013.01); *H01L 21/02247* (2013.01); *H01L 21/02318* (2013.01); *H01L 21/0337* (2013.01); *H01L 21/28273* (2013.01); *H01L 21/31111* (2013.01); *H01L 21/02252* (2013.01)

(58) Field of Classification Search
CPC combination set(s) only.
See application file for complete search history.

(56) References Cited

U.S. PATENT DOCUMENTS 7,858,467 B2 * 12/2010 Kamioka ........... H01L 21/76208
257/E21.546
2003/0119334 A1 * 6/2003 Kwak ............... H01L 21/02164
438/775

FOREIGN PATENT DOCUMENTS

TW 200837896 9/2008
TW 201344911 A 11/2013

* cited by examiner

*Primary Examiner* — Mohammad Islam
*Assistant Examiner* — Ratisha Mehta
(74) *Attorney, Agent, or Firm* — Winston Hsu; Scott Margo

(57) ABSTRACT

A method of manufacturing a semiconductor device, which includes the steps of forming a gate stack structure made up of a floating gate, an inter-poly dielectric, a control gate and a metal layer on a substrate, forming a conformal liner on the gate stack structure, covering a mask layer on the liner, where the mask layer is lower than the metal layer so that a portion of the liner is exposed, and performing a nitridation treatment to transform the exposed liner into a nitrided liner, so that at least the portion of the metal layer in the gate stack structure is covered by the nitrided liner.

11 Claims, 7 Drawing Sheets

METHOD OF MANUFACTURING A SEMICONDUCTOR DEVICE

BACKGROUND OF THE INVENTION

1. Field of the Invention

The present invention relates to a method for forming a semiconductor device, and in particular, to a method for forming a flash memory.

2. Description of the Prior Art

Flash memory is a common type of non-volatile memory. Flash memory cells may include a source region and a drain region that is spaced apart from the source region by an intermediate channel region. A memory cell, including a charge structure (e.g., a floating gate, a charge trap, or other similar structure), is disposed over the channel region and is electrically isolated from the other elements by a dielectric material, such as an oxide. For example, a tunnel dielectric material (which may also be referred to in the art as a "gate dielectric" material) may be disposed between the charge structure and the channel region. A control gate, of the memory cell, is located over the charge structure. The control gate may be electrically separated from the charge structure by a charge block region, such as another dielectric layer that may be referred to in the art as an "inter-poly dielectric" (IPD), an "intergate insulator," or an "intergate dielectric." Thus, the charge structure may be configured as a floating gate that is electrically "floating" so that it is insulated from both the channel and the control gate.

To improve the properties of gates and gate interconnects even further, integrated circuit manufacturers are investigating the use of pure metal layers. Tungsten, for example, is of particular interest because it is relatively inexpensive, has a high melting point (approximately 3,410 degrees C.), and is known to be compatible with current manufacturing techniques.

The use of unreacted tungsten metal as a conductive word line layer can create certain problems during the fabrication process of the integrated circuit. The word line materials often must be capable of withstanding high temperature processing in an oxidizing environment. For example, shortly after the word line stack is patterned, a source/drain reoxidation is performed to repair damage that occurs to the gate oxide near the corners of source and drain regions as a result of etching the word line. The source/drain reoxidation reduces the electric field strength at the gate edge by upwardly chamfering the edge, thereby reducing the "hot electron" effect that can cause threshold voltage shifts.

However, during such a reoxidation process, exposed tungsten along the edges or sidewalls of the stack is converted quickly to tungsten trioxide gas at high temperatures in the presence of oxygen. Moreover, sublimation of the tungsten oxide is not self-limiting. The oxidation of the tungsten layer as well as oxidation of the barrier layer degrades the electrical properties of the word line.

In order to resolve the issues mentioned above, one method is forming a liner (such as a silicon nitride layer) on the word line stack before the reoxidation process is performed, so as to protect the tungsten from oxygen outside. However, other issues will still occur. For example, the thickness of the SiN liner should large enough (such as larger than 3 nm) to prevent the tungsten from oxidation, but if the thickness of the SiN liner is too big (such as larger than 2 nm), the SiN liner will easily remain on the corner of the word line stack and contact the exposed gate dielectric. In this way, during the ashing process for forming the lightly-doped drain (LDD), the nitrogen impurities in the SiN layer will penetrate and contaminate the gate dielectric, and this damage may result in degraded performance (e.g., increased resistance and capacitance) of the resulting memory cell. Furthermore, some conventional methods for forming a liner cannot be harmoniously integrated into the standard processes. For example, the liner may cause the reoxidation process to be insufficient or deteriorated. Thus, fabricating memory devices, including flash memory devices, without degradation to performance is often a challenge.

Fabricating memory cells often involves patterning a conductive material of the control gate region before patterning a conductive material of the charge structure region. After patterning the control gate region, but before patterning the charge structure region, a liner may be formed on the conductive material of the control gate region to provide protection to the conductive material during the latter (i.e., "subsequent") patterning process in which the conductive material of the charge structure region is patterned. Nonetheless, conventional liners may not survive the subsequent patterning process and, as such, may leave at least partially exposed the conductive material of the control gate region. The exposure may result in damage to the conductive material of the control region. The damage may be in the form of any one of roughened sidewalls, undercuts at interfaces with neighboring regions, and decreased widths relative to the initially-patterned control gate region. This damage may result in degraded performance (e.g., increased resistance and capacitance) of the resulting memory cell.

Thus, fabricating memory devices, including flash memory devices, without degradation to performance is often a challenge.

SUMMARY OF THE INVENTION

To solve the issues mentioned above, the present invention provides a method for forming a semiconductor device. The feature of the semiconductor device is protecting the metal layer of a gate stack structure that is easily oxidized, but not influencing the performance of the gate stack structure and the memory device.

The present invention provides a method of manufacturing a semiconductor device, which includes the steps of forming agate stack structure made up of a floating gate, an inter-poly dielectric, a control gate and a metal layer on a substrate, forming a conformal liner on the gate stack structure, covering a mask layer on the liner, wherein the mask layer is lower than the metal layer so that a portion of the liner is exposed, and performing a nitridation treatment to transform the exposed liner into a nitrided liner, so that at least the portion of the metal layer in the gate stack structure is covered by the nitrided liner.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
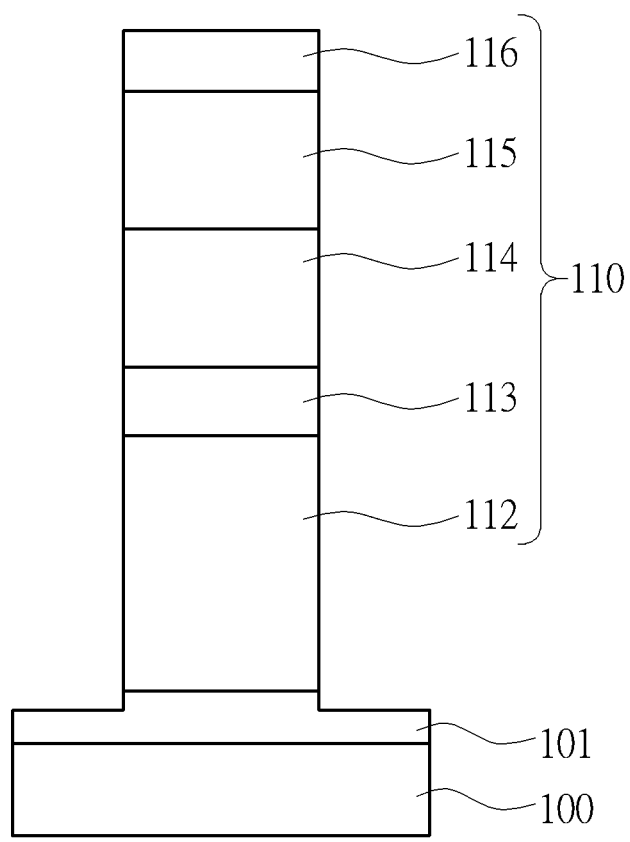
FIGS. 1-7 illustrate the schematic cross section diagrams of the semiconductor device according to the method for forming the semiconductor device of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

The present invention provides a method for forming a semiconductor device, a memory cell and/or a memory array. The feature of the present invention is to form a liner on the surface of the exposed conductive layer (metal layer), and performing a nitridation treatment on the liner that is above a predetermined level, so as to transform the exposed liner into a nitrided liner. The nitrided liner can protect the metal layer well in the following steps, thereby preventing the exposed metal layer from being oxidized. Besides, the liner that is under the predetermined level can be thinned or be removed, preventing the liner from influencing the performance of the semiconductor device.

As used herein, the term "radical oxidation" refers to a process in which a semiconductor structure is subjected to heat in the presence of radicals, such as oxygen radicals. For example, and without limitation, radical oxidation includes in situ steam generation (ISSG).

As used herein, the term "nitride liner" refers to a material derived from a liner and having a greater amount of nitrogen per volume unit compared to the initial material of the liner.

As used herein, the term "substrate" means and includes a base material or construction upon which components, such as those within memory cells as well as other semiconductor device structures, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium (Si.sub.1-xGe.sub.x, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in or on the base semiconductor structure or foundation.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated ninety degrees, inverted, etc.) and the spatially relative descriptors used herein interpreted accordingly.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" another element, there are no intervening elements present.

Unless the context indicates otherwise, the materials described herein may be formed by any suitable technique including, but not limited to, spin coating, knife coating, dip coating, blanket coating, chemical vapor deposition ("CVD"), atomic layer deposition ("ALD"), plasma enhanced ALD, and physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, abrasive planarization, and other methods.

The methods disclosed herein may be used to form at least one semiconductor device structure having a conductive region. As nonlimiting examples, the methods may be used to form conductive contacts, conductive interconnects, transistors, and memory devices, including, for example, dynamic random access memory (DRAM) cells and flash memory (e.g., to be included in a flash memory array with NAND, NOR, AND, or other flash memory architecture).

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

Please refer to FIGS. 1-7, which illustrate the schematic cross section diagrams of the semiconductor device according to the method for forming the semiconductor device of the present invention. For the sake of clarity and convenience in the drawings, there is only one semiconductor device (such as a memory cell structure) shown in each figure, and parts of the elements, such as the source, drain, contact holes are omitted in each figure.

First, as shown in FIG. 1, a substrate 100 is provided. The substrate 100 may include a silicon substrate, a doped (such as p-type or n-type doped) single-crystal silicon substrate, or a wafer having a semiconductive region formed in advance. The substrate 100 may be a homogeneous substrate, or may have integrated circuits formed thereon or integrated. A tunneling dielectric layer 101 can be formed on the substrate 100, such as a silicon dioxide ($SiO_2$) layer, a silicon nitride ($Si_3N_4$) layer or others suitable materials. The tunneling dielectric layer 101 may also consists of a plurality of insulating materials or a plurality of insulating regions.

As shown in FIG. 1, after the tunneling dielectric layer 101 is formed, a gate stack structure 110 is then formed on the tunneling dielectric layer 101. The gate stack structure 110 includes a floating gate (FG) 112, an inter-gate/poly dielectric (IPD) 113, a control gate (CG) 114, a metal layer 115 and a hard mask 116 from bottom (the side near the substrate 100) to top. The gate stack structure 110 is used as a charge storage node, capacitive coupling with the active area (AA) of the substrate 100 through the tunneling dielectric layer 101. The gate stack structure 110 can be formed through a conventional lithography etching process, for example, firstly, the material layer of the floating gate 112, the inter-poly dielectric 113, the control gate 114, the metal layer 115 and the hard mask 116 are formed in sequence on the tunneling dielectric layer 101. Next, a first lithography etching process is performed, patterning the hard mask 116. Afterwards, a second lithography etching process is performed, using the patterned hard mask 116 as the protective layer, and patterning the material layer disposed below, and so as to form the gate stack structure 110. It is noteworthy that during the patterning process (lithography etching process) mentioned above, the tunneling dielectric layer 101 is not patterned, only parts of the tunneling dielectric layer 101 are removed, and the thickness of the tunneling dielectric layer 101 becomes thinner after the patterning process is performed. Of course, in another embodiment, the exposed tunneling dielectric layer 101 (the exposed tunneling dielectric layer 101 that is not disposed right below the gate stack structure 110) can be removed completely.

In the gate stack structure 110, the floating gate 112 is a charge load structure, and used for capturing charges. The material of the floating gate 112 includes at least one metal, such as tungsten, titanium, cobalt, etc., or a compound containing metal components, such as a metal silicide, a metal nitride, or conductive dopant doped semiconductor material, such as doped polysilicon, but not limited thereto. The floating gate 112 can be formed through a chemical vapor deposition (CVD), metal organic chemical vapor deposition (MOCVD), physical vapor deposition (PVD), atomic layer deposition (ALD) or others suitable processes.

In the gate stack structure 110, the inter-poly dielectric 113 is formed between the floating gate 112 and the control gate 114, to electrically isolate from the charge flow between these two gates. In this way, the charge storage structure can be designed as a floating gate, allowing it to be electrically floating and electrically isolated from the control gate and the channel region. The inter-poly dielectric 113 may include silicon dioxide ($SiO_2$) or silicon nitride ($Si_3N_4$), or an ONO multi-layer structure ($SiO_2$—$Si_3N_4$—$SiO_2$) including the silicon dioxide and the silicon nitride. In addition, the inter-poly dielectric 113 may also comprises high-k materials, such as aluminum oxide ($Al_2O_3$) or hafnium silicon oxynitride (HfSiON), but not limited thereto. Similarly, the inter-poly dielectric 113 can be formed through the methods such as ALD, CVD, PVD mentioned above or jet vapor deposition (JVD). Take the inter-poly dielectric 113 is an ONO layer as an example, the first layer ($SiO_2$) and the middle layer ($Si_3N_4$) are formed through an ALD process, and the rest of the $SiO_2$ layer is formed through a CVD process. In some embodiments, the inter-poly dielectric 113 may entirely cover the floating gate 112.

In the gate stack structure 110, the control gate 114 is formed on the inter-poly dielectric 113, capacitive coupling with the floating gate 112 through the inter-poly dielectric 113, and it can be seen as one part of the memory cell. The material of the control gate 114 may include conductive dopant doped semiconductor material, such as the doped polysilicon, metal silicide or metal nitride, but not limited thereto. In one embodiment of the present invention, control gates may also be a multi-layer structure consisting of a doped conductive region (such as the doped polysilicon mentioned above) and an area composed of metal, in the embodiment shown in FIG. 1, further comprising a metal layer 115 disposed on the control gate 114, where the metal layer can be deemed as one part of the control gate, and the material of the metal layer includes tungsten (W) or nickel (Ni). Forming a pure metal layer in the word line helps to improve the performance of the gate and the interconnected structure, but the un-reactive pure metal layer (such as tungsten) is easy to be oxidized and to be deteriorated in the subsequent heating processes (such as the source/drain reoxidation step), resulting in deterioration of performance. The present invention can solve the issues mentioned above.

In addition, a cap layer 116 is further disposed on the gate stack structure 110, which is made of insulating materials, such as $SiO_2$, $Si_3N_4$, or silicon oxynitride (SiON), and in another embodiment, the hard mask mentioned above can be used as the cap layer.

Figure 2:
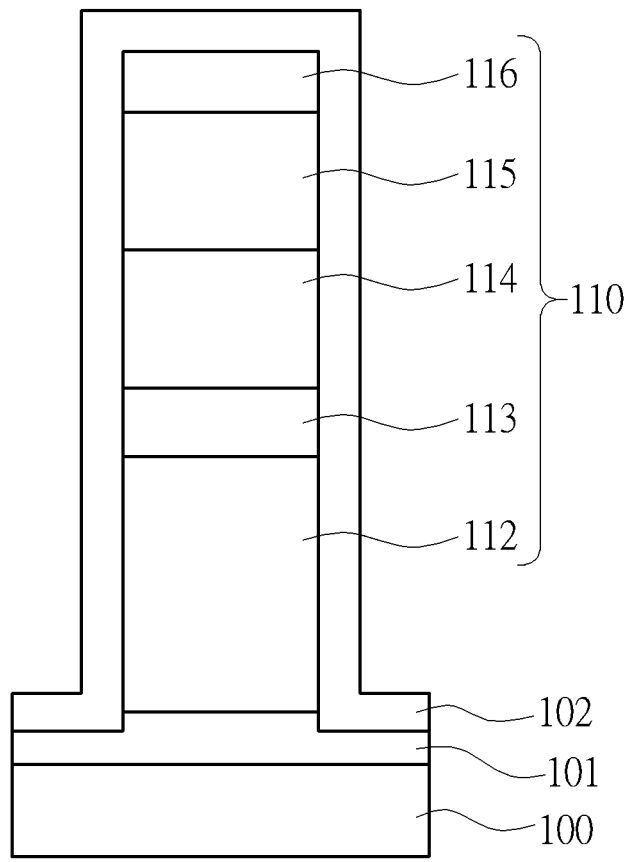
Figure 3:
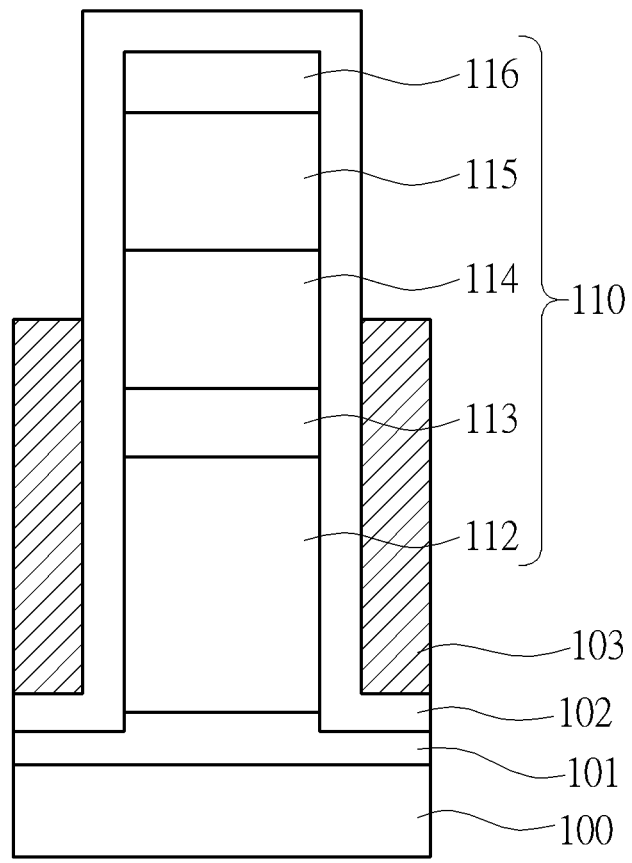

Please refer to FIG. 2, after the gate stack structure 110 is formed, a liner 102 is then formed on the substrate 100 and on the gate stack structure 110 conformally, to protect the sidewalls of the gate stack structure 110 from the environmental impact in the following steps, such as oxidizing environment or etching environment, or to protect the active area of the substrate from metal contamination of the control gate 114 or the metal layer 115. The liner 102 conformally covers on the gate stack structure 110, and further extends to contact and entirely cover the tunneling dielectric layer 101. In this embodiment, the material of the liner 102 is similar to the material of the cap layer 116 (such as $SiO_2$, $Si_3N_4$, SiON), and preferably, it can be formed through an ALD method.

In one embodiment of the present invention, even though the liner 102 helps to prevent the oxidation or the particle contamination issues of the metal layer 115, since the liner 102 directly contacts the tunneling dielectric layer 101, when there is a subsequent high-temperature process, the impurity particles in the liner 102 (such as nitrogen impurities) can easily diffuse into the tunneling dielectric layer 101. In one case, in order to effectively protect the metal layer 115, the thickness of the liner 102 cannot be too small (such as larger than 2 nm), but if the liner 102 has thicker thickness, the impurity particles can more easily diffuse into the tunneling dielectric layer 101, especially from larger stress near the corner, thus significantly affecting the electrical properties of the semiconductor device.

In order to solve the issue mentioned above, one method of the present invention is to strengthen parts of the liner 102, so as to make the liner 102 have a protective function, but to not influence the performance of the device. Please refer to FIG. 3. First, a hard mask 103 is formed on the liner 102, to cover the liner 102 and the substrate 100. Next, a selectively etching back process is then performed on the hard mask 103, so that the top surface of the hard mask 103 is lower than the metal layer 115 of the gate stack structure 110, and parts of the liner 102 are then exposed. The material of the hard mask 103 includes photoresist or materials having different etching rate than that of the liner 102, but not limited thereto. The purpose of this step is to expose parts of the liner 102 which are covering the metal layer 115, so that the following strengthening process can be performed.

Figure 4:
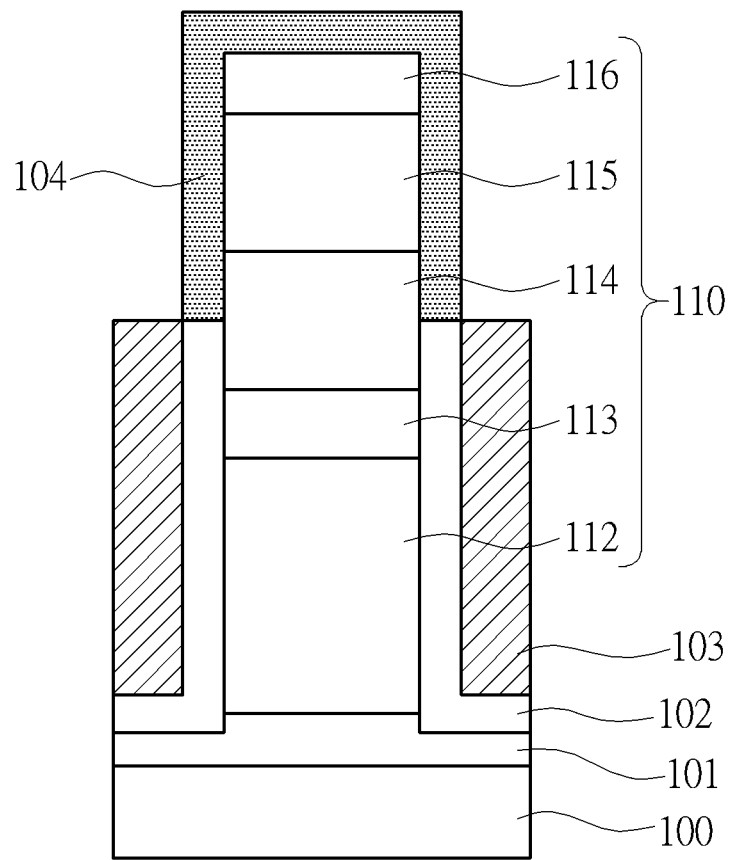

Please refer to FIG. 4. After the liner 102 is partially exposed, a nitridation treatment is performed on the liner 102. The nitridation treatment includes plasma nitridation and/or post nitridation annealing (PNA), and the purpose is to modify the liner 102 that covers the metal layer 115, so that part of the liner 102 can be strengthened, for example, part of the liner 102 may become more etch-resistant and more anti-oxidation. As shown in FIG. 4, after this nitridation treatment is performed, the upper portion of the liner 102 has been transformed into the nitrided liner 104 with different material.

Figure 5:
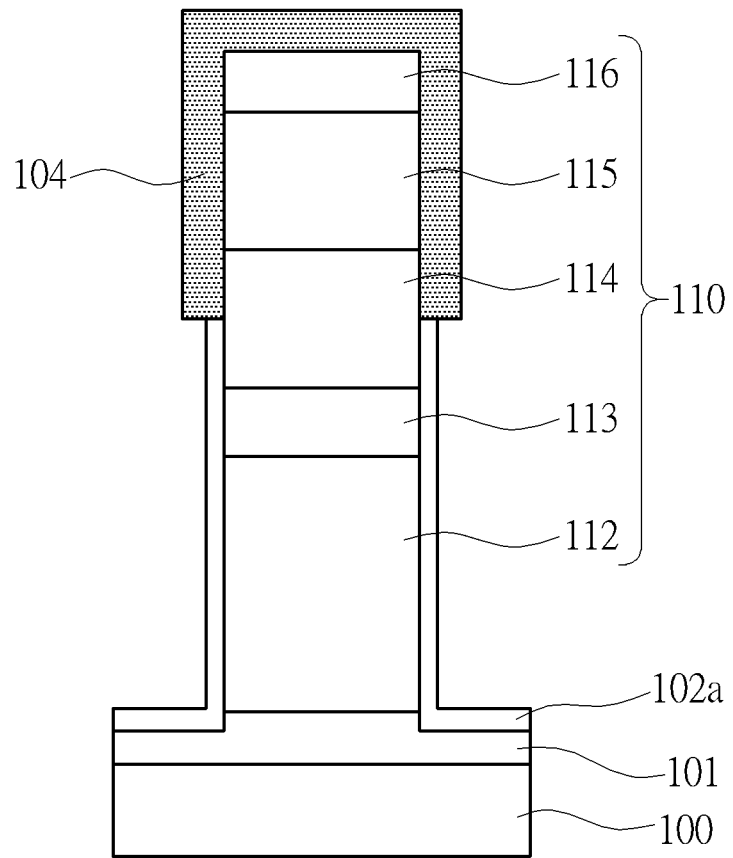

Please refer to FIG. 5, after the nitrided liner 104 is formed, an ashing process is performed, so as to remove the hard mask 103 completely, and to expose a remaining portion of the liner 102. Afterwards, a selectively etching process (such as a wet-etching process) is performed, further to thin the liner 102, therefore, a thinned liner 102a can be formed, wherein the thickness of the thinned liner 102a is smaller than a predetermined value (such as smaller than 2 nm). Or in another case, the liner 102 can be removed completely. In this step, since the nitrided liner 104 and the liner 102 have different material, the wet-etching process only removes the liner 102, but does not remove the nitrided liner 104. The purpose of this step is to thin the liner 102 that contacts to the tunneling dielectric layer 101 disposed below, so that the tunneling dielectric layer 101 is hardly affected by impurity diffusion of particles.

Figure 6:
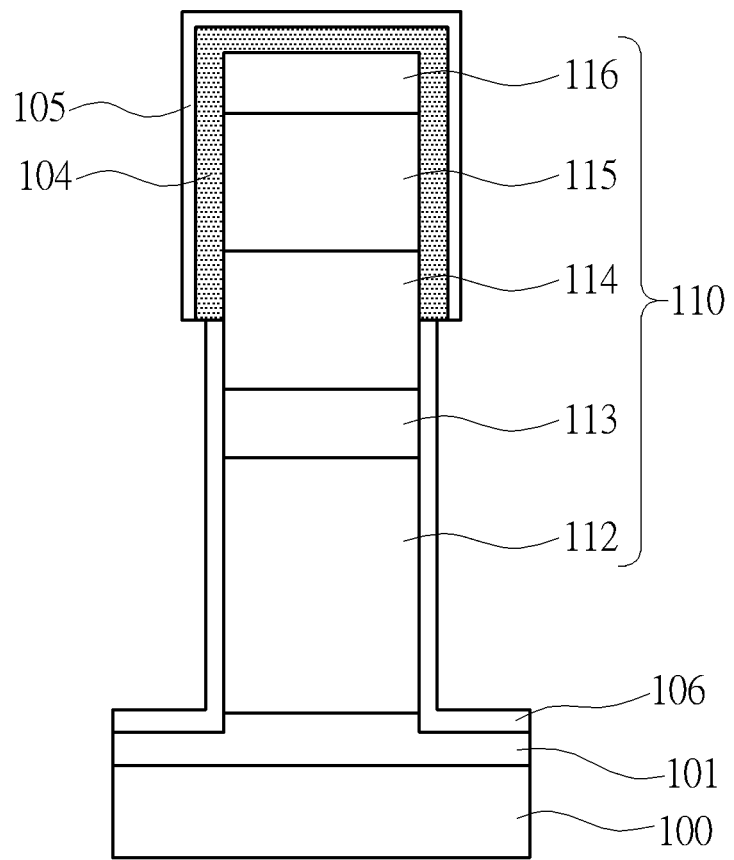

After the thickness of the liner 102 is lower than a specific value, the regular semiconductor processes are then performed, such as performing a lightly-doped drain (LDD) ashing process. As shown in FIG. 6, the LDD ashing process is to remove the photoresist which is used during the process for forming the LDD region. Generally, the ashing process in performed under an oxygen-containing plasma-based environment, and it will completely remove the photoresist which remains on the substrate 100, and to transform the thinned liner 102a into an oxidized layer 106. At meanwhile, the ashing process will also oxidize the nitrided liner 104, so that the surface of the nitrided liner 104 is converted to the silicon oxynitride layer 105.

Figure 7:
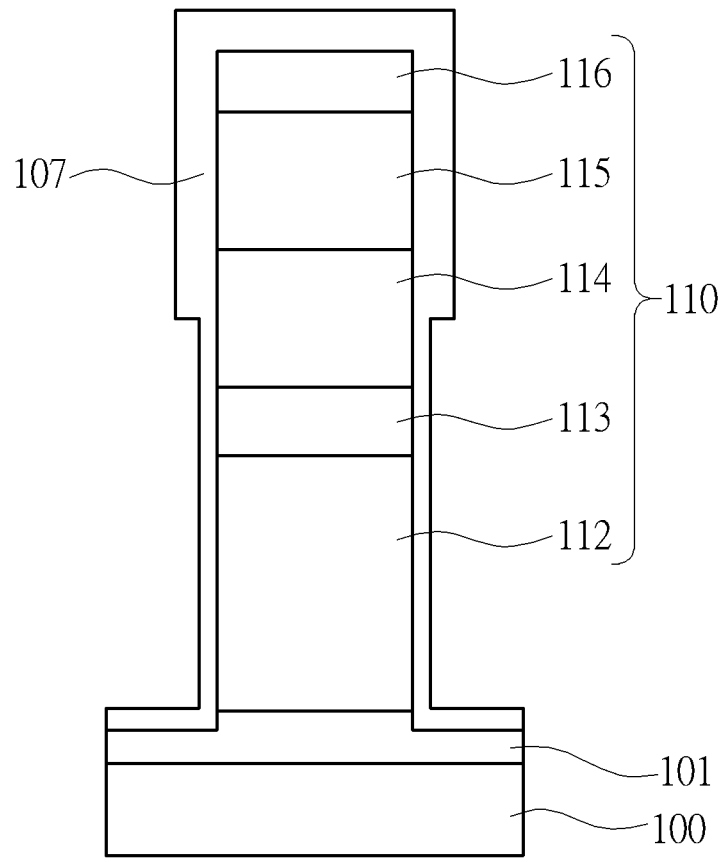

Finally, please refer to FIG. 7, after the LDD ashing process, depending on the product and the process, an oxidizing process can be selectively performed, to planarize the surface of the gate stack structure 110. For example, the slot plane antenna (SPA) plasma oxidation process of Tokyo Electron can be used, to oxidize the surface of the gate stack structure 110. As shown in FIG. 7, the nitrided liner 104, the silicon oxynitride layer 105 and the oxidized layer 106 on the gate stack structure 110 are integrated into a single layer, relative flat oxidized liner 107.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a semiconductor device, comprising:
   providing a substrate;
   forming a gate stack structure on the substrate, wherein the gate stack structure includes a floating gate, an inter-poly dielectric, a control gate and a metal layer from bottom to top;
   forming a liner conformally on the gate stack structure and on the substrate;
   forming a mask layer on the liner, wherein a top surface of the mask layer is lower than the metal layer of the gate stack structure, so that a portion of the liner is exposed; and
   performing a nitridation treatment to transform the exposed liner into a nitrided liner, so that at least the portion of the metal layer in the gate stack structure is covered by the nitrided liner.

2. The method of claim 1, wherein the method for forming the mask layer further comprises performing an etching back process, so that the top surface of the mask layer is lower than the metal layer of the gate stack structure.

3. The method of claim 1, further comprising:
   removing the mask layer entirely after the nitridation treatment, to expose a remaining portion of the liner; and
   performing a thinning process to thin the liner.

4. The method of claim 3, wherein the thinning process comprises a wet-etching process.

5. The method of claim 3, further comprising performing a slot plane antenna plasma oxidation treatment after the thinning process, to oxidize the nitrided liner and the thinned liner.

6. The method of claim 3 wherein the thickness of the thinned liner is smaller than 2 nm.

7. The method of claim 3, after the nitridation treatment, further comprising performing a light doped drain (LDD) ashing process, and both the thinned liner and a surface of the nitrided liner are oxidized.

8. The method of claim 1, wherein the nitridation treatment includes a plasma nitridation and a post nitridation annealing.

9. The method of claim 1, wherein the material of the metal layer comprises tungsten, nickel or cobalt.

10. The method of claim 1, wherein the material of the liner comprises silicon oxide, silicon nitride or silicon oxynitride.

11. The method of claim 7, after the LDD ashing process, further comprising performing an oxidizing process for completely oxidizing the nitrided liner.

* * * * *